(12) United States Patent
Cheng et al.

(10) Patent No.: US 11,656,271 B2
(45) Date of Patent: May 23, 2023

(54) WAFER INSPECTION SYSTEM

(71) Applicant: MPI CORPORATION, Chu-Pei (TW)

(72) Inventors: Yi-Hsuan Cheng, Chu-Pei (TW); Hung-I Lin, Chu-Pei (TW); Po-Han Peng, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/699,610

(22) Filed: Mar. 21, 2022

(65) Prior Publication Data

US 2022/0299564 A1 Sep. 22, 2022

Related U.S. Application Data

(60) Provisional application No. 63/212,129, filed on Jun. 18, 2021, provisional application No. 63/164,027, filed on Mar. 22, 2021.

(30) Foreign Application Priority Data

Jan. 20, 2022 (TW) .................................. 111102442

(51) Int. Cl.
*G01R 1/067* (2006.01)
*G01R 31/28* (2006.01)
(52) U.S. Cl.
CPC ..... *G01R 31/2865* (2013.01); *G01R 1/06727* (2013.01)
(58) Field of Classification Search
CPC ............ G01R 1/06727; G01R 31/2886; G01R 31/2889; G01R 1/06716; G01R 1/07342; G01R 1/07307; G01R 1/07314; G01R 1/07378; G01R 1/06711; G01R 1/073; G01R 1/06738; G01R 31/2865; G01R 1/06772; G01R 1/067; G01R 1/0491;
(Continued)

(56) References Cited

U.S. PATENT DOCUMENTS 5,828,225 A * 10/1998 Obikane ............ G01R 1/06705
324/750.25
9,658,285 B2 * 5/2017 Kouno ............... G01R 31/2886
(Continued)

FOREIGN PATENT DOCUMENTS

TW 201827836 A 8/2018
TW M603962 U 11/2020

*Primary Examiner* — Vinh P Nguyen
(74) *Attorney, Agent, or Firm* — Birch, Stewart, Kolasch & Birch, LLP

(57) ABSTRACT

A wafer inspection system includes a supporting device having electrically connected supporting and contact portions for supporting a wafer's back, and a probe device having a probe and elastic contact members. When a probe tip of the probe contacts the wafer's front, a contact tip of the elastic contact member is abutted against a contact surface of the contact portion. The contact tip is higher than the probe tip. The contact surface is higher than the wafer's front. Alternatively, the contact surface having a radius larger than or equal to twice the wafer's radius. The horizontal distance between the probe tip and the contact tip is larger than or equal to twice the wafer's radius. This satisfies the test requirement of short-pulse test signal and prevents the structural design and transmitting stability of the elastic contact members from being affected by the inspection temperature.

21 Claims, 11 Drawing Sheets

(58) Field of Classification Search
CPC .............. G01R 1/0408; G01R 31/2884; G01R 1/06744; G01R 31/26; G01R 31/2808; G01R 31/2851; G01R 1/06705; G01R 31/31905; G01R 1/0675; G01R 1/0416; G01R 31/2601; G01R 31/2637; H01R 13/2407; H01R 12/52; H01R 13/2464; H01R 2201/20; H01R 13/2435; H01R 13/2414; H01R 13/24; H01R 13/2428; H01R 12/714; H01R 13/2471; H01R 13/514; H01R 13/2442; H01R 43/02

See application file for complete search history.

(56) References Cited

U.S. PATENT DOCUMENTS

| | | | | |
|---|---|---|---|---|
| 10,295,567 | B2 * | 5/2019 | Ku | G01R 31/31716 |
| 11,181,572 | B2 * | 11/2021 | Zhuang | G01R 31/2886 |
| 11,353,501 | B2 * | 6/2022 | Chih | G01R 31/2891 |

\* cited by examiner ically connected to the probe device 14 through a cable 17. The wafer 11 is supported by an electrically conductive supporting unit 19 and the driver IC 16 is also electrically connected to the supporting unit 19 through a cable 18. A test loop is thus formed and the test signal outputted from the driver IC 16 is able to be transmitted to the positive electrode of the die via the cable 17 and the probe device 14 and then transmitted back to the driver IC 16 from the negative electrode of the die, i.e. the back of the wafer, via the supporting unit 19 and the cable 18, so that the light emitting portion on the front of the die emits light. The light emitting from the die is received by a light receiving device (not shown), such as an integrating sphere, located above the probe device 14 for the measurement of optical characteristics.

WAFER INSPECTION SYSTEM

BACKGROUND OF THE INVENTION

1. Field of the Invention

The present invention relates generally to wafer inspection systems and more particularly, to a wafer inspection system which is provided around the outer periphery of probes of a probe device thereof with elastic contact members for being electrically connected with the negative electrode of a wafer.

2. Description of the Related Art

Referring to FIG. 1, it is well known that a vertical type die refers to a die provided with a positive contact and a negative contact respectively on the front and back thereof. For example, the back 12 of a wafer 11 may serve as a common plane negative contact of all dies of the wafer 11. The vertical type die is usually a light emitting die, such as VCSEL, micro LED, mini LED, and so on and the light emitting portion thereof is located on the front 13 of the wafer 11. As regards the probing of the above-described vertical type die, the positive electrode of the die, i.e. the front of the wafer, is usually contacted by a probe 15 of a probe device 14, such as a probe card or an edge sensor. A driver integrated circuit 16 (hereinafter referred to as "driver IC") is electrically connected to the probe device 14 through a cable 17. The wafer 11 is supported by an electrically conductive supporting unit 19 and the driver IC 16 is also electrically connected to the supporting unit 19 through a cable 18. A test loop is thus formed and the test signal outputted from the driver IC 16 is able to be transmitted to the positive electrode of the die via the cable 17 and the probe device 14 and then transmitted back to the driver IC 16 from the negative electrode of the die, i.e. the back of the wafer, via the supporting unit 19 and the cable 18, so that the light emitting portion on the front of the die emits light. The light emitting from the die is received by a light receiving device (not shown), such as an integrating sphere, located above the probe device 14 for the measurement of optical characteristics.

However, for the test signal transmission manner adopted in the above-described inspection system that the test signal is outputted from the driver IC 16 and transmitted back to the driver IC 16 through the cables 17 and 18, the material of the cables 17 and 18 will affect the test signal transmitted therethrough. Further, because of long transmission path length, the test signal is liable to be affected by inductance effect to cause serious deformation and distortion of waveform of short-pulse and large-current test signal, thus making the inspection imprecise or even invalid. Accordingly, the above-described inspection system cannot satisfy the test requirement of the short-pulse test signal.

In order to solve the above-described problem, Taiwan Patent No. M603962 discloses an inspection system without such cable, e.g. the cable 18 shown in FIG. 1, which is provided between the supporting unit for supporting the wafer, i.e. a wafer carrier, and the driver IC. The supporting unit for supporting the wafer is provided thereon with a plurality of conducting units protruding upwardly. The positive contact of the driver IC is electrically connected with the probe and the negative contact of the driver IC is electrically connected with an electrically conductive portion provided on the bottom surface of the probe device. When the positive electrode of the die is contacted by the probe, the electrically conductive portion of the probe device and the conducting unit located on the supporting unit are in contact with each other and thereby electrically connected with each other. In this way, a test loop with relatively shorter path is formed, which can satisfy the test requirement of short-pulse test signal.

SUMMARY OF THE INVENTION

However, for the die inspections under specific temperature conditions, the temperature of the above-described supporting unit for supporting the wafer will be adjusted by a temperature control device, which means the temperature of the supporting unit may be raised or lowered. Therefore, the conducting units disposed on the supporting unit are liable to be affected by the temperature of the supporting unit, e.g. thermal expansion and contraction caused by temperature changes. In order to improve this situation, the configuration of the conducting units will be more complicated, such as provided with thermal insulation members, thereby increasing the cost. The above-described thermal expansion and contraction will also cause the unstable performance of the conducting units, resulting in that the contact stability thereof is not easy to be controlled, thereby affecting the stability of the test signal transmission. Besides, the above-described probing process is usually performed in a way that the wafer is moved upwardly by the supporting unit to make the die contacted by the probe. In addition, the conducting unit is usually an elastic contact member (pogo pin) provided with a spring and a contact head. In order for the spring to bear the weight of the contact head and to elastically push the contact head to cause good contact between the contact head and the electrically conductive portion of the probe device to provide stable test signal, the spring constant (K-value) of the conducting unit will be provided higher. As such, the load of the vertical movement of the supporting unit may be increased, especially in the condition with relatively more conducting units. Furthermore, as shown in FIG. 10 of the aforementioned patent (the reference numerals used below are given accordingly to the associated reference numerals used in the figures of the patent), when the outermost die of the wafer is contacted by the probe, the conducting unit 210 is abutted against the innermost side of the electrically conductive portion 320 of the probe device. Under this circumstance, if the wafer is placed with a little positional deviation, such as slightly deviated to the left, in order to make the detection part 310 contact the outermost (the leftmost) die of the wafer, the conducting unit 210 may have to be moved to the edge of the electrically conductive portion 320 located between the electrically conductive portion 320 and the probe (the detection part 310), resulting in partial contact of a single conducting unit 210 or even non-contact of partial conducting units 210, thereby undesirably decreasing the contact area, which in turn affecting the stability of the test signal transmission.

The present invention has been accomplished in view of the above-noted circumstances. It is an objective of the present invention to provide a wafer inspection system, which can satisfy the test requirement of short-pulse test signal and prevent the structural design and transmission stability of test signal transmitting members from being affected by the inspection temperature.

To attain the above objective, the present invention provides a wafer inspection system, which is defined with a vertical axis, i.e. the feeding axis along which the probe moves to contact the wafer during the inspection, and a horizontal axis perpendicular to the vertical axis. The wafer inspection system includes a supporting device and a probe device. The supporting device includes a supporting portion and a contact portion located around the outer periphery of the supporting portion. The supporting portion and the contact portion are electrically conductive and electrically connected with each other. The supporting portion is configured to support the back of a wafer in a way that the wafer is electrically connected with the contact portion. The probe device is capable of being electrically connected with a driver IC and transmitting a test signal of the driver IC. The probe device is disposed above the supporting portion and the contact portion in a way that the probe device and the supporting device are movable relative to each other along the vertical axis and the horizontal axis. The probe device includes a probe region and a contact region located around the outer periphery of the probe region. The probe region includes an electrically conductive probe protruding toward the supporting device for contacting the front of the wafer. The contact region includes an electrically conductive module containing a plurality of elastic contact members protruding toward the supporting device.

According to the wafer inspection system of the present invention, when a die of the wafer is contacted by the probe, the test signal outputted from the driver IC can be transmitted to the positive electrode of the die via the probe and then transmitted back to the driver IC from the negative electrode of the die via the supporting portion and contact portion of the supporting device and the electrically conductive module of the probe device sequentially. In other words, because the signal is transmitted through the contact portion of the supporting device and the elastic contact members of the probe device, no cable for transmitting signal has to be provided between the supporting device and the driver IC. Since the transmission path length is substantially reduced, the present invention can satisfy the test requirement of short-pulse test signal. Besides, due to the elastic contact members are located on the probe device rather than on the supporting device, the inspection system can be prevented from being affected by the inspection temperature, and as a result the transmission stability is improved while the configuration thereof can be designed relatively simply and the cost can be lowered. In addition, because the elastic contact members are located on the probe device rather than on the supporting device, the springs of the elastic contact members have no need to bear the weight of the contact heads, so that the spring constant (K-value) can be set relatively lower. In this way, under the precondition of preventing the vertical movement of the supporting device from overload, the present invention can be provided with relatively more elastic contact members to raise the transmission stability of the test signal.

The above-described technical features of the present invention can satisfy the test requirement of short-pulse test signal and prevent the structural design and transmission stability of the test signal transmitting members from being affected by the inspection temperature. Further, because the elastic contact members are located on the probe device, if there is no further consideration, the elastic contact member may easily collide with the die of the wafer when the die of the wafer is contacted by the probe of the probe device. This undesirably limits the flexibility of the arrangement of the elastic contact members. In more details, the elastic contact members are located on the probe device and disposed around the outer periphery of the probe. In this way, when the die located on the outermost side (e.g. the leftmost side) of the wafer is contacted by the probe of the probe device, the elastic contact member located on the probe device may collide with the other outermost side (e.g. the rightmost side) of the wafer. In order to further solve the above problem, an invention including a construction capable of preventing the elastic contact members located on the probe device from colliding with the device under test is developed with effort based on the above-described technical concept of the present invention and is described below.

The probe of the probe device has a probe tip for contacting the wafer. Each of the elastic contact members has a contact tip for being abutted against the contact portion of the supporting device. The contact portion of the supporting device has a contact surface for the contact tip of the elastic contact member to be abutted thereagainst. The contact tip of each of the elastic contact members is located higher than the probe tip of the probe along the vertical axis. The contact surface of the supporting device is located higher than the front of the wafer along the vertical axis.

The probe device in the present invention is configured with a height difference, i.e. the contact tip of the elastic contact member is disposed higher than the probe tip of the probe, and the supporting device is also configured with height difference, i.e. the contact portion is disposed higher than the supporting portion and thus causing the contact surface higher than the front of the wafer. In this way, when the front of the wafer is contacted by the probe, the elastic contact member located corresponding to the contact surface is abutted against the contact surface because the contact surface is higher than the front of the wafer. Those elastic contact members not abutted against the contact surface are prevented from colliding with the wafer because the contact tips of the elastic contact members are higher than the probe tip of the probe and thus higher than the front of the wafer. Accordingly, the present invention provides a wafer inspection system which can satisfy the test requirement of short-pulse test signal, prevent the structural design and transmission stability of the test signal transmitting members from being affected by the inspection temperature, and improve the flexibility of the arrangement of the elastic contact members to prevent the collision between the elastic contact members and the wafer. Preferably, the height difference between the contact tip of each of the elastic contact members and the probe tip of the probe along the vertical axis is smaller than or equal to the height difference between the contact surface of the supporting device and the front of the wafer along the vertical axis, so as to ensure that the elastic contact members can be reliably abutted against the contact surface when the wafer is contacted by the probe, thereby ensuring the transmission stability of the test signal.

For example, the supporting device may include a chuck having the contact portion and the supporting portion to allow the wafer to be directly placed on the chuck. In this case, because the wafer is directly placed on the chuck having the contact portion and the supporting portion, the test signal is transmitted sequentially from the back of the wafer, the supporting portion of the chuck, and the contact portion of the chuck and then back to the driver IC. As such, the present invention can satisfy the test requirement of short-pulse test signal due to the transmission path length is relatively short. Alternatively, the supporting device may include a chuck and a carrier to allow the wafer to be disposed on the carrier and placed on the chuck along with the carrier. The chuck and the carrier may have the contact portion and the supporting portion, respectively. In this case, because the wafer is placed on the carrier, the wafer can be moved independently from the chuck having the contact portion along with the carrier. Therefore, the time for transferring the wafer during the inspecting can be further shortened, thereby lowering the whole inspection time under the benefits that the present invention can satisfy the test requirement of short-pulse test signal. In other words, in the above-described two cases, the chuck is configured with the aforementioned height difference; alternatively, the carrier may be configured to have both the contact portion and the supporting portion, in such a way that the conventional chuck with a flat-shaped table can be directly applied thereto. In this case, because the wafer is directly placed on the carrier having the contact portion and the supporting portion, the test signal is transmitted sequentially from the back of the wafer, the supporting portion of the carrier, and the contact portion of the carrier, and then back to the driver IC. As such, the present invention can satisfy the test requirement of short-pulse test signal due to the transmission path length is relatively short.

Alternatively, the present invention may be configured with a special design of a horizontal distance to avoid the above-described collision problem of the elastic contact members and the wafer. Specifically speaking, the outer perimeter of the wafer is defined with a first radius and the outer perimeter of the contact surface is defined with a second radius. The second radius is larger than or equal to twice the first radius. The horizontal distance along the horizontal axis between the probe tip of the probe and the contact tip of the elastic contact member located closest thereto is larger than or equal to twice the first radius. As a result, when any position of the front of the wafer is contacted by the probe, the contact tips of the elastic contact members are always located at a position not corresponding to the position of the wafer, such that the elastic contact members are prevented from colliding with the wafer. In this way, the present invention provides a wafer inspection system which can satisfy the test requirement of short-pulse test signal, prevent the structural design and transmission stability of the test signal transmitting members from being affected by the inspection temperature, and improve the flexibility of the arrangement of the elastic contact members to prevent the collision between the elastic contact members and the wafer. Preferably, the horizontal distance along the horizontal axis between the probe tip of the probe and the contact tip of the elastic contact member located closest thereto is smaller than or equal to the second radius, so as to ensure at least one of the elastic contact members can be abutted against the contact surface when the wafer is contacted by the probe, thereby ensuring the transmission stability of the test signal. Besides, the contact tip of each of the elastic contact members may be located lower than the probe tip of the probe along the vertical axis. In this case, the supporting device has no need to be configured with the height difference, that is to say the contact surface of the contact portion and the surface of the supporting portion for supporting the wafer may be the same surface. As such, the front of the wafer is slightly higher than the contact surface of the contact portion and thus the height difference therebetween is the thickness of the wafer. In this way, the height difference between the contact tip of the elastic contact member and the probe tip of the probe can be minimized to be larger than or equal to the thickness of the wafer, therefore the configuration of the wafer inspection system can be simplified. Accordingly, the present invention can further enhance the contact force of the contact tip of the elastic contact member abutted against the contact surface when the wafer is contacted by the probe. In the circumstance that the contact surface is not higher than the front of the wafer, the above-described collision problem of the elastic contact member and the wafer still can be avoided by way of the configuration with the horizontal distance as mentioned above, and thus the present invention can further ensure the transmission stability of the test signal.

In the present invention, because the elastic contact members and the probe of the probe device having the above-described height difference or horizontal distance can be disposed on a same substrate, such as the circuit board of the aforementioned probe card, the configuration thereof is simple and enables the high integration of components, thereby reducing the number of components under the benefits that the present invention can satisfy the test requirement of short-pulse test signal by way of the technical feature that the transmission path length of the test signal is reduced. Alternatively, the elastic contact members may be disposed on an installation member. The installation member may be a circuit board and disposed on the outer perimeter of the substrate by engaging or other manners. Or, the installation member may be a metal cathode plate and disposed around the outer periphery of the substrate in a way of being relatively fixed to and separated from the substrate. In such cases, the existing probe device can be applied in the present invention as long as the installation member provided with the elastic contact members is further installed therewith. In other words, such configurations have sufficient assembly flexibility and adaptability. In this case, the elastic contact members are disposed on an individual installation member independently of the substrate. Therefore, when the substrate and/or the probe needs maintenance or replacement or when the elastic contact members need maintenance or replacement, each maintenance or replacement can be performed independently. As such, the maintenance or replacement cost can be lowered and the transmission path length of the test signal is reduced under the benefits that the present invention can satisfy the test requirement of short-pulse test signal and prevent the structural design and transmission stability of the test signal transmitting members from being affected by the inspection temperature.

Preferably, the elastic contact members may be arranged around two opposite sides of the probe. More preferably, the elastic contact members may be symmetrically arranged around the two opposite sides of the probe. In this case, the elastic contact members can be symmetrically arranged close to the probe and thus the arrangement of the elastic contact members can be optimized and further minimized so as to ensure the elastic contact members can be reliably abutted against the contact surface of the supporting device when the wafer is contacted by the probe, thereby ensuring the transmission stability of the test signal.

Preferably, the probe device includes a substrate. The driver IC may be disposed on the substrate and electrically connected with the probe and the elastic contact members through internal circuits of the substrate respectively. In this case, because the driver IC is directly disposed on the substrate and electrically connected with the probe and the elastic contact members through internal circuits of the substrate respectively, the present invention can ensure the reduced transmission path length, thereby satisfying the test requirement of short-pulse test signal.

Preferably, the test signal outputted from the driver IC is transmitted via the test loop from the probe to the front of the wafer and then back to the driver IC from the back of the wafer via the supporting portion and the contact portion of the supporting device and the electrically conductive module of the probe device sequentially. In this case, the positive contact of the driver IC is electrically connected with the probe and the negative contact of the driver IC is electrically connected with the electrically conductive module located on the bottom surface of the probe device. When the positive electrode of the die is contacted by the probe, the electrically conductive module of the probe device and the contact portion of the supporting device are also in contact with each other and thereby electrically connected with each other. Compared with the prior art, the present invention enables a shortened test loop without utilizing a cable and thereby satisfying the test requirement of short-pulse test signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
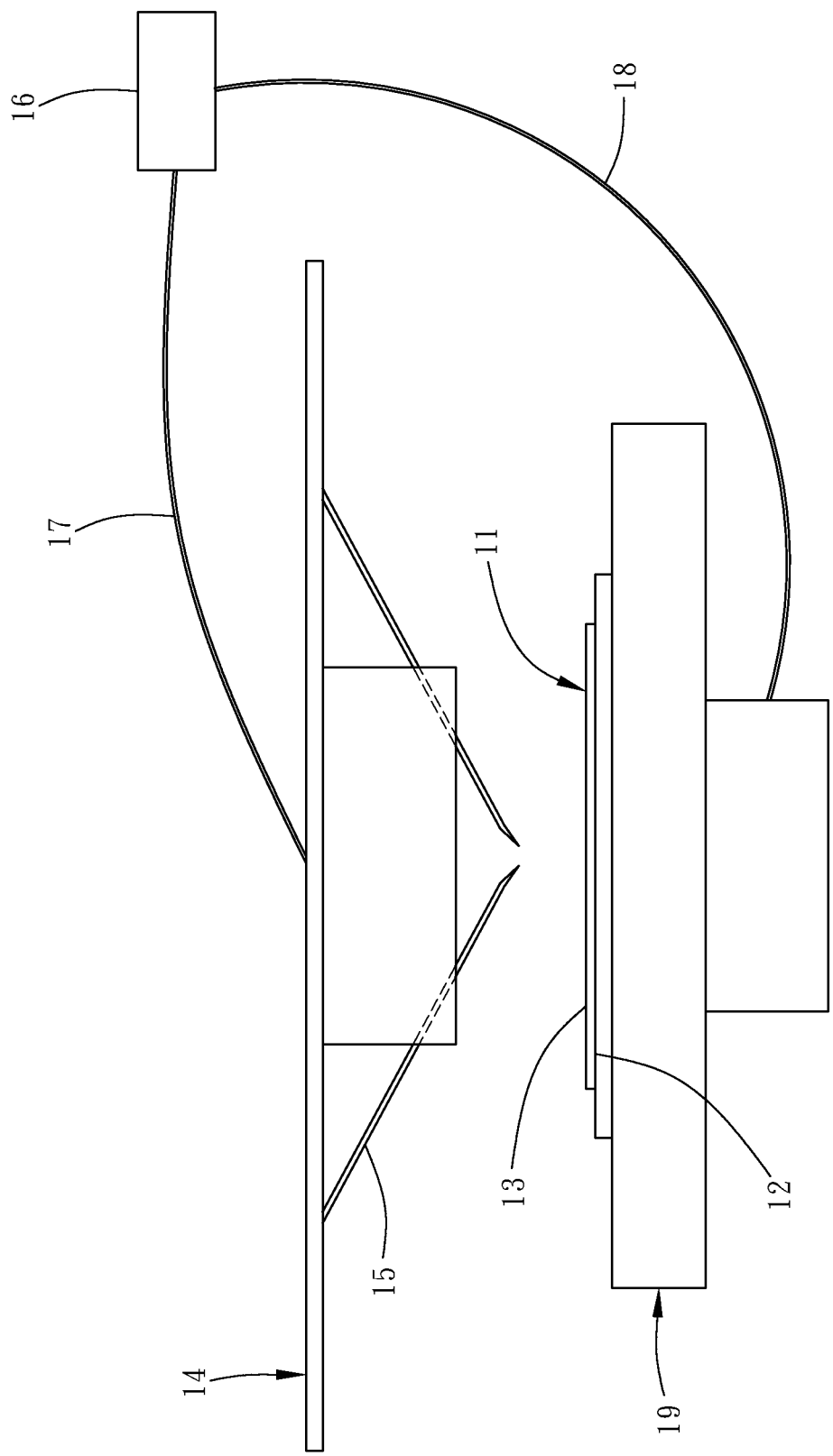
FIG. 1 is a schematic view of a conventional wafer inspection system and a wafer.

First of all, it is to be mentioned that same reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the actual dimensions and numbers, and the features mentioned in one embodiment can be applied in the other embodiments if it can be accomplished. Besides, when it is mentioned that an element is disposed on another element, it means that the former element is directly disposed on the latter element, or the former element is indirectly disposed on the latter element through one or more other elements between the aforesaid former and latter elements. When it is mentioned that an element is directly disposed on another element, it means that no other element is disposed between the aforesaid former and latter elements.

Figure 2:
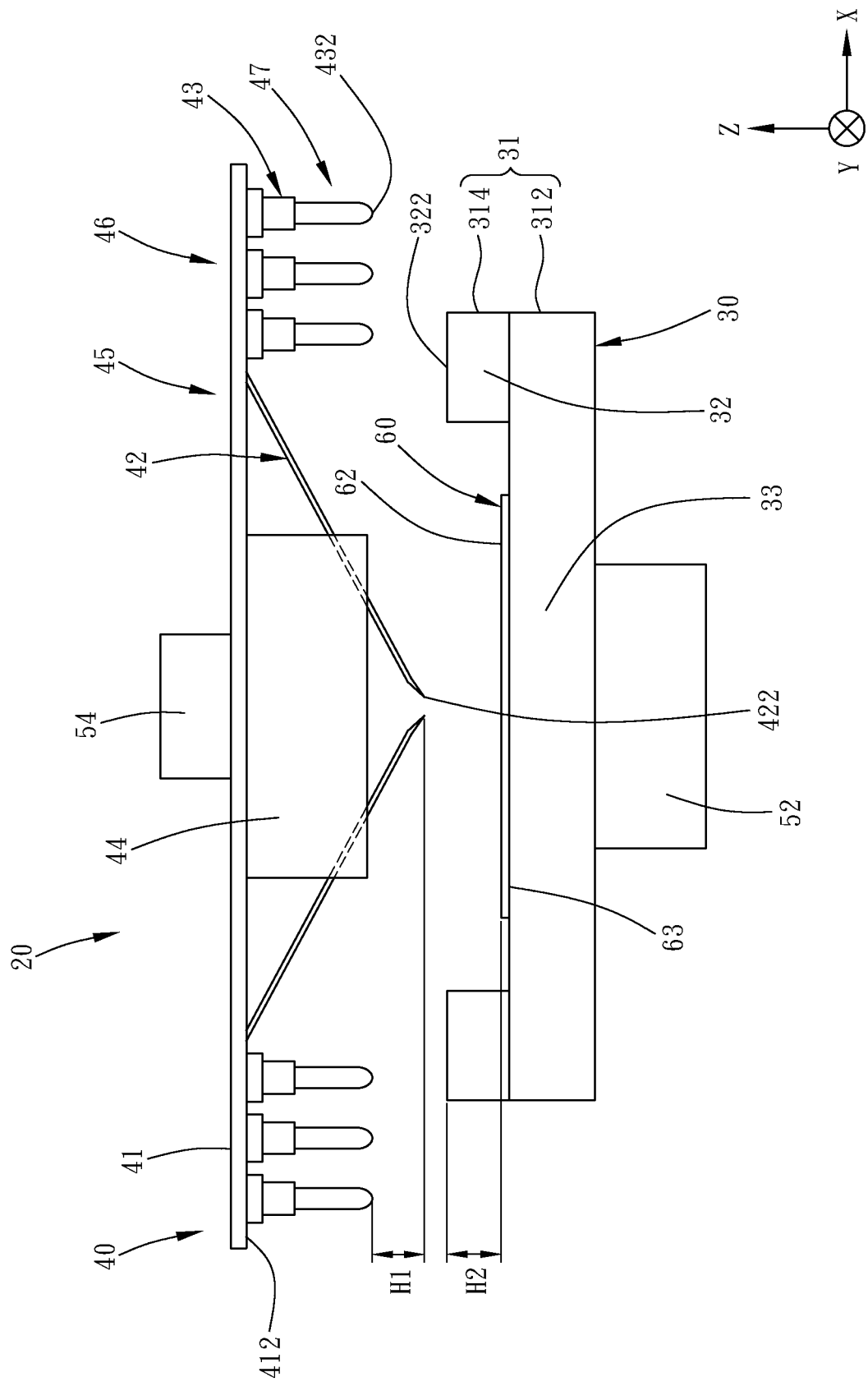
FIG. 2 is a schematic view of a wafer inspection system according to a first preferred embodiment of the present invention and a wafer.

Referring to FIG. 2, a wafer inspection system 20 according to a first preferred embodiment of the present invention includes a supporting device 30 and a probe device 40.

The supporting device 30 and the probe device 40 are movable relative to each other along a vertical axis (Z-axis) and two horizontal axes (X-axis and Y-axis). For example, the probe device 40 in this embodiment is fixed and stationary. The supporting device 30 is disposed on a moving device 52 and capable of being driven by the moving device 52 to move along X-axis, Y-axis, and Z-axis. The supporting device 30 is adapted to support a wafer 60 including many tiny vertical type dies. For simplifying the figures, the dies of the wafer 60 are not shown in the figures of the present invention. The positive contacts of the dies are located on the front 62 of the wafer 60. In this embodiment, the front 62 of the wafer 60 is the upper surface of the wafer 60 facing toward the probe device 40. The back 63 of the wafer 60 is a common plane negative contact of the dies. The probe device 40 is adapted to probe the dies. In this embodiment, the vertical axis (Z-axis) is the feeding axis along which the probes 42 of the probe device 40 moves to contact wafer 60 during the inspection and is described in detail as follows.

The supporting device 30 in this embodiment only includes a chuck 31 installed on the moving device 52. The wafer 60 is moved by a pick-and-place device (not shown) to be directly placed on the chuck 31. Specifically speaking, the chuck 31 in this embodiment includes a main body 312 with a flat-shaped table and an elevated plate 314 fixed to the main body 312. The elevated plate 314 is annular-shaped and disposed along the perimeter of the main body 312 to form a contact portion 32 of the supporting device 30. The partial main body 312 not covered by the elevated plate 314 forms a supporting portion 33 of the supporting device 30. As such, the contact portion 32 is located around the outer periphery of the supporting portion 33. The main body 312 and the elevated plate 314 of the chuck 31 are both made of electrically conductive material such as metal, so the supporting portion 33 and the contact portion 32 of the supporting device 30 are both electrically conductive and electrically connected with each other. The back 63 of the wafer 60 is attached to the supporting portion 33 and thus is electrically connected with the contact portion 32. It is to be mentioned that the conventional chuck with a flat-shaped table can serve as the main body 312. After the elevated plate 314 is additionally installed to the main body 312, the chuck 31 of this embodiment can be composed. Alternatively, the main body 312 and the elevated plate 314 of the chuck 31 may be made monolithically.

The probe device 40 in this embodiment primarily includes a substrate 41, a plurality of electrically conductive probes 42, and a plurality of electrically conductive elastic contact members 43. The probe device 40 may be a probe card and the substrate 41 is a circuit board of the probe card. A fastening block 44 made of black resin is fixed on a lower surface 412 of the substrate 41. The probes 42 are arranged in two lines along the Y-axis and fastened to the lower surface 412 of the substrate 41 by the fastening block 44. The probe 42 is provided at an end thereof with a probe tip 422, which will be specified hereinafter, and has the other end electrically connected to the substrate 41. The elastic contact members 43 are arranged around two opposite sides of the probes 42. Specifically speaking, the elastic contact members 43 are arranged in three lines along the Y-axis on each of two sides of the probes 42 and directly fixed to the lower surface 412 of the substrate 41 by welding. Preferably, the elastic contact members 43 are symmetrically arranged around two opposite sides of the probes 42. In this way, the probe device 40 is formed with a probe region 45 including the probes 42 and a contact region 46 located around the outer periphery of the probe region 45 and including the elastic contact members 43.

The elastic contact member 43 in the present invention may be the conventional vertical elastic probe (e.g. pogo pin), which is provided in a metal housing thereof with a spring. The vertical elastic probe has a top rod slidably installed in the metal housing. An end of the top rod is located in the metal housing and abutted against the spring. Another end of the top rod is exposed out of the metal housing to form a contact head. When the contact head is abutted against the contact portion 32, the spring is pressed and thereby elastically compressed. The probe 42 in the present invention is unlimited to the cantilever probe used in this embodiment. For example, the probe 42 may be the conventional vertical elastic probe, which means the probe may be similar to the elastic contact member 43. The number and arranged manner of the probes 42 are unlimited to those provided in this embodiment, as long as there is at least one probe 42. The number and arranged manner of the elastic contact members 43 are also unlimited to those provided in this embodiment, as long as there are a plurality of elastic contact members 43 disposed at predetermined positions around the outer periphery of the probes 42. From the figures of the present invention, it can be seen that the elastic contact members 43 may be arranged around each of two sides of the probes 42 in one line, two lines, three lines, four lines and so on. The number of the lines is unlimited and can be adjusted according to the requirement of different configurations.

The probe device 40 is fastened by a fastening device (not shown) to be disposed above the supporting portion 33 and the contact portion 32 of the supporting device 30 in a way that the lower surface 412 of the substrate 41 faces toward the supporting device 30. Therefore, the elastic contact members 43 are arranged to protrude downwardly from the lower surface 412 of the substrate 41. Specifically speaking, the probes 42 and the elastic contact members 43 approximately protrude downwardly from the lower surface 412 of the substrate 41 toward the supporting device 30. The probe 42 is provided at the lowest end thereof with a probe tip 422 for contacting the wafer 60 and the elastic contact member 43 is provided at the lowest end thereof with a contact tip 432 for being abutted against the contact portion 32 of the supporting device 30. The probe device 40 is adapted to transmit test signal between a driver IC 54 and the wafer 60. The driver IC 54 may be directly fixed to the substrate 41 of the probe device 40 and electrically connected with the probes 42 and the elastic contact members 43 through internal circuits of the substrate 41 or external conductive wires respectively. Specifically speaking, the probes 42 are respectively electrically connected with the positive contacts of the driver IC 54. The elastic contact members 43 may be connected in series or in parallel and then collectively electrically connected to the negative contact of the driver IC 54. In other words, the elastic contact members 43 of the probe device 40 collectively form an electrically conductive module 47. As long as at least one of the elastic contact members 43 is electrically connected with the negative electrode, i.e. the back 63, of the wafer 60 through the supporting device 30, the negative electrode of the wafer 60 is electrically connected with the negative contact of the driver IC 54.

In addition to the above-described structure, this embodiment has the structural feature that the contact tips 432 of the elastic contact members 43 are located higher than the probe tips 422 of the probes 42 along the vertical axis (i.e. Z-axis among the figures), and the height difference therebetween is represented by H1. Besides, the contact portion 32 of the supporting device 30 has a contact surface 322 for the contact tips 432 of the elastic contact members 43 to be abutted thereagainst. The contact surface 322 is located higher than the front 62 of the wafer 60 along the vertical axis (Z-axis) and the height difference therebetween is represented by H2. It is preferable to configure the aforementioned height difference H1 smaller than or equal to the height difference H2, for ensuring the elastic contact member 43 to be reliably abutted against the contact surface 322 when the wafer 60 is contacted by the probes 42. A detailed description is given below.

Figure 3:
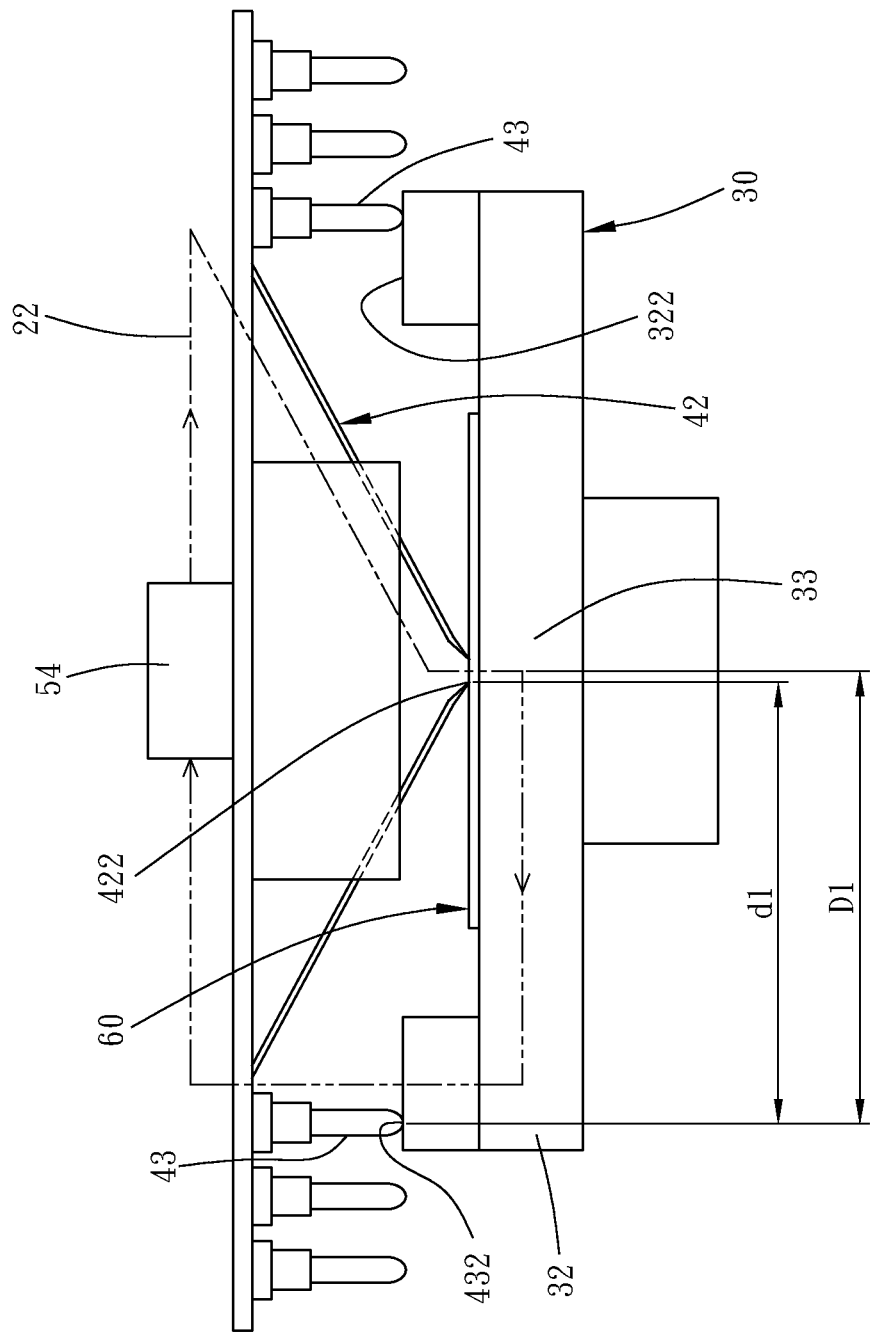
FIG. 3 and FIG. 4 are similar to FIG. 2, but showing the statuses that the wafer inspection system probes the wafer.
Figure 4:
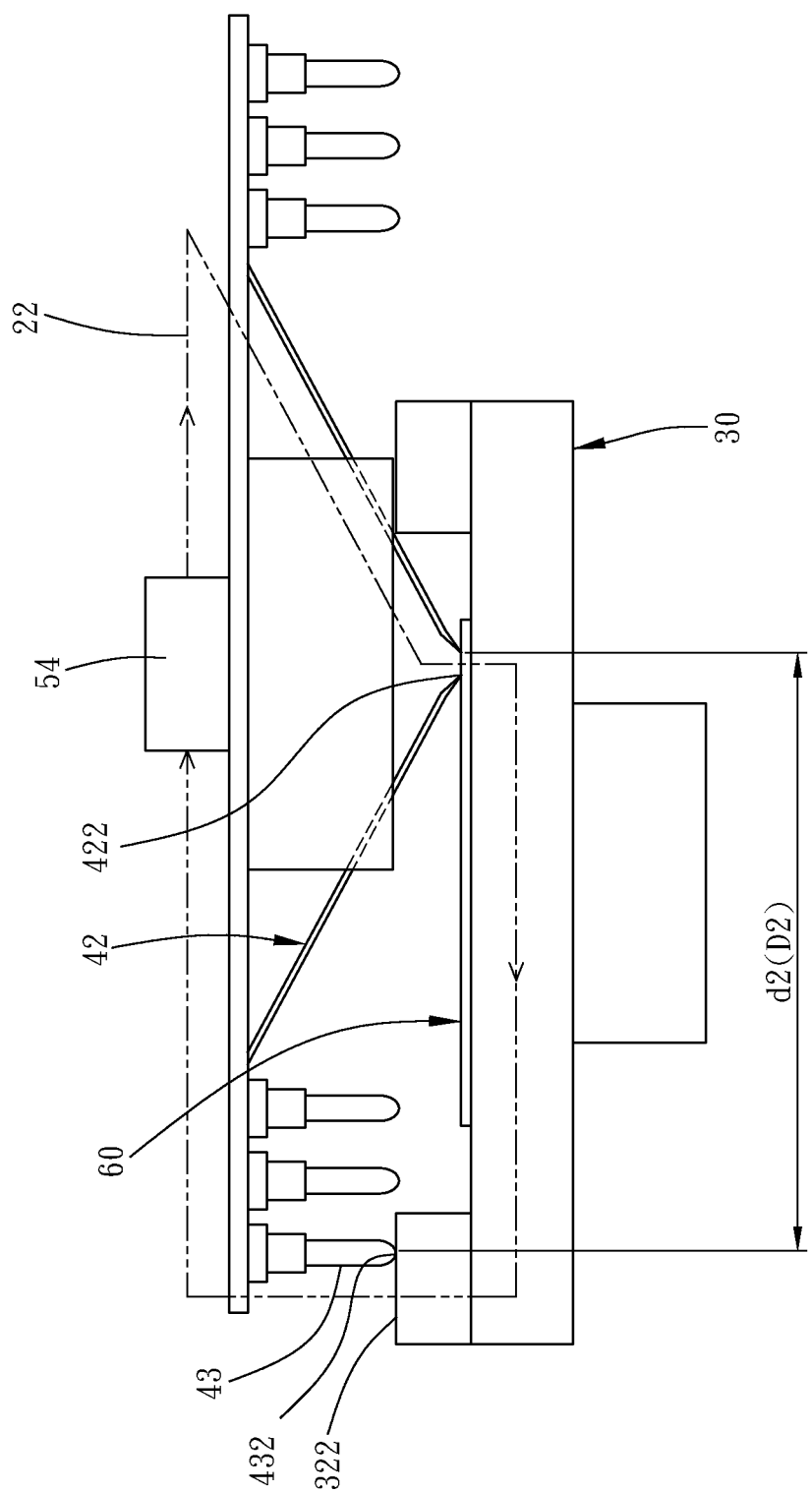

When the dies located in the central region of the wafer 60 are contacted by the probes 42 as shown in FIG. 3, the two lines of elastic contact members 43 located closest to the probes 42 are abutted against the contact surface 322 of the contact portion 32 of the supporting device 30. At this time, the test signal outputted from the positive contacts of the driver IC 54 can be transmitted to the positive contacts of the probed dies via the probes 42 and then transmitted back to the negative contact of the driver IC 54 from the negative contact on the back 63 of the wafer via the supporting portion 33 and the contact portion 32 of the supporting device 30 and the elastic contact members 43 sequentially, and thus a test loop 22 as shown in FIG. 3 is formed accordingly. Specifically speaking, the moving device 52 is not included in the test loop 22 in this embodiment and thus the test signal will not go through the moving device 52. For the condition that the outermost die of the wafer 60 is contacted by the probe 42, such as the condition shown in FIG. 4 that the rightmost die of the wafer 60 is contacted by the probe 42, the leftmost elastic contact member 43 is abutted against the contact surface 322 of the contact portion 32 of the supporting device 30. At this time, the test loop 22 as shown in FIG. 4 is formed accordingly. Specifically speaking, the moving device 52 is not included in the test loop 22 in this embodiment and thus the test signal will not go through the moving device 52. In FIG. 4, although some of the elastic contact members 43 disposed on the left side of the probes 42 are located in the area corresponding to the wafer 60, the contact tips 432 of the elastic contact members 43 will not collide with the wafer 60 because the contact tips 432 are higher than the probe tips 422 of the probes 42 and thereby certainly higher than the front 62 of the wafer 60. Likewise, when the leftmost die of the wafer 60 is contacted by the probe 42, the rightmost elastic contact member 43 will be abutted against the contact surface 322 to form the test loop 22. At this time, the elastic contact members 43 disposed on the right side of the probes 42 and located in the area corresponding to the wafer 60 will also not collide with the wafer 60.

As a result, no cable for transmitting signal has to be provided between the supporting device 30 and the driver IC 54 in the present invention. Further, in this embodiment that the driver IC 54 is directly fixed to the substrate 41 of the probe device 40, a cable for transmitting signal can also be omitted between the probe device 40 and the driver IC 54. Accordingly, the test loop 22 formed in the present invention has a reduced transmission path length, and therefore the present invention can satisfy the test requirement of short-pulse test signal. Besides, under the test requirement that the temperature of the supporting device 30 should be raised or lowered by a temperature control device (not shown), the elastic contact members 43 are prevented from being directly affected by the temperature of the supporting device 30. Therefore, no thermal insulation members or any other configurations for minimizing the influence caused by temperature variation have to be attached to the elastic contact members 43. As a result, the configuration of the present invention can be designed relatively simply and the cost can be lowered while the transmission stability is improved. In addition, because the elastic contact members 43 are located on the probe device 40 rather than on the supporting device 30, the springs of the elastic contact members 43 have no need to bear the weight of the contact heads, so that the springs can be set with relatively lower resistance. In this way, under the precondition of preventing the vertical movement of the supporting device 30 from overload, the present invention can be provided with relatively more elastic contact members 43 to raise the transmission stability of the test signal.

Referring to FIG. 3, a horizontal distance d1 is defined along a horizontal axis such as X-axis between the probe tip 422 of the probe 42 and the contact tip 432 of the elastic contact member 43 located closest thereto. A horizontal distance D1 is defined along the horizontal axis (X-axis) between the center of the wafer 60 and a contact point on the contact surface 322, e.g. the point contacted by the contact tip 432 as shown in FIG. 3. The horizontal distance d1 is smaller than or equal to the horizontal distance D1 and it is preferable that the horizontal distance d1 is equal to the horizontal distance D1. Referring to FIG. 4, a horizontal distance d2 is defined along a horizontal axis such as X-axis between the probe tip 422 of the probe 42 and the contact tip 432 of the elastic contact member 43 located farthest away therefrom. A horizontal distance D2 is defined along the horizontal axis (X-axis) between the outermost die of the wafer 60 and a contact point on the contact surface 322 located farthest away therefrom, e.g. the point contacted by the contact tip 432 as shown in FIG. 4. It is preferable that the horizontal distance d2 is equal to the horizontal distance D2. In this way, it is ensured that when any die on the wafer 60 is contacted by the probe 42, the contact tip 432 of at least one of the elastic contact members 43 is abutted against the contact surface 322. In this embodiment, the elastic contact member 43 located closest to the probe tip 422 of the probe 42 is the elastic contact member 43 whose contact tip 432 has the smallest distance along the horizontal axis (X-axis) from the probe tip 422 of the probe 42. Furthermore, when the probe tip 422 of the probe 42 is taken as the center of a circle, the distance between the probe tip 422 of the probe 42 and the contact tip 432 of the elastic contact member 43 is the radius of the circle.

Figure 5:
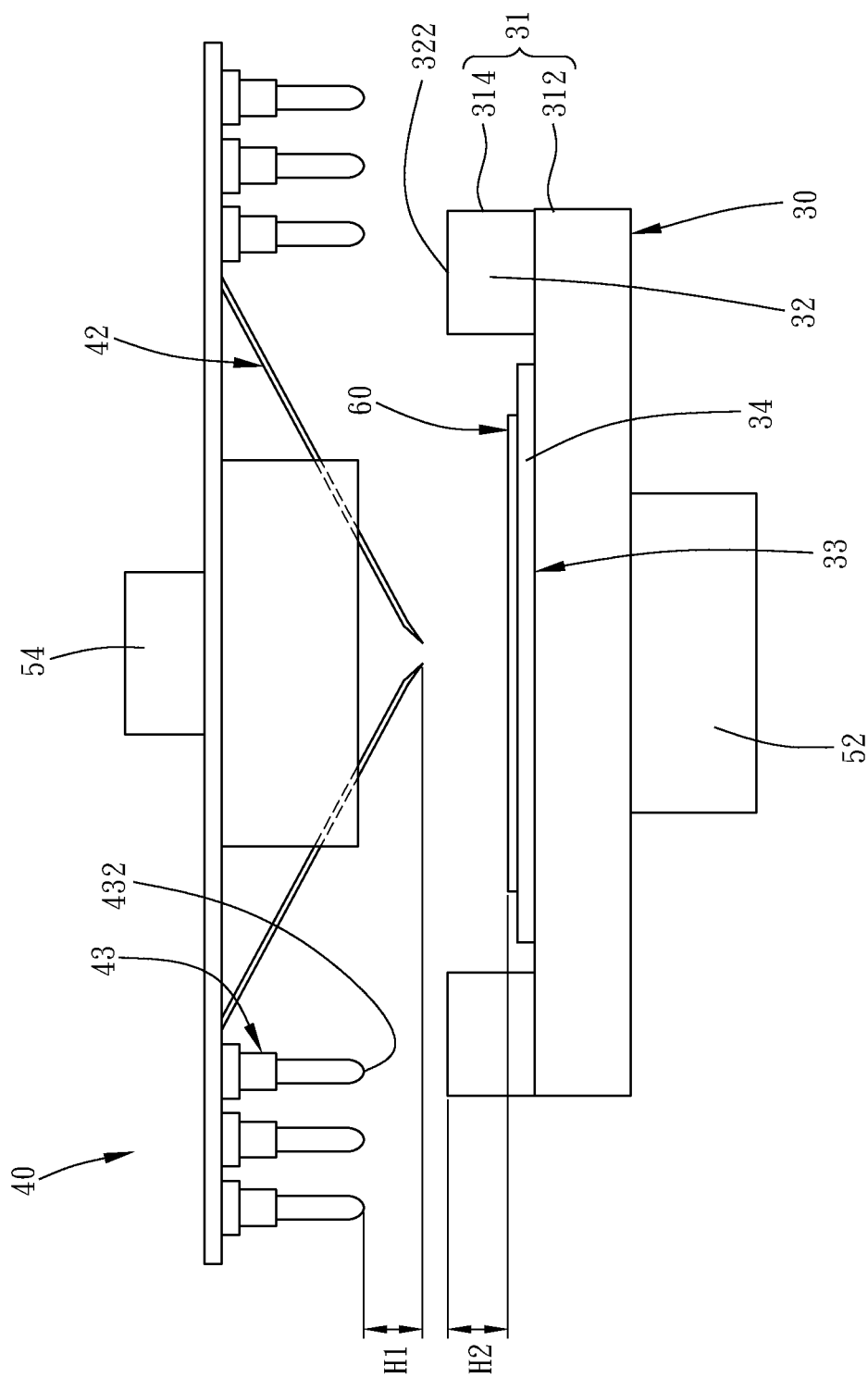
FIG. 5 and FIG. 6 are similar to FIG. 2, but showing other configurations of the supporting device of the wafer inspection system.
Figure 6:
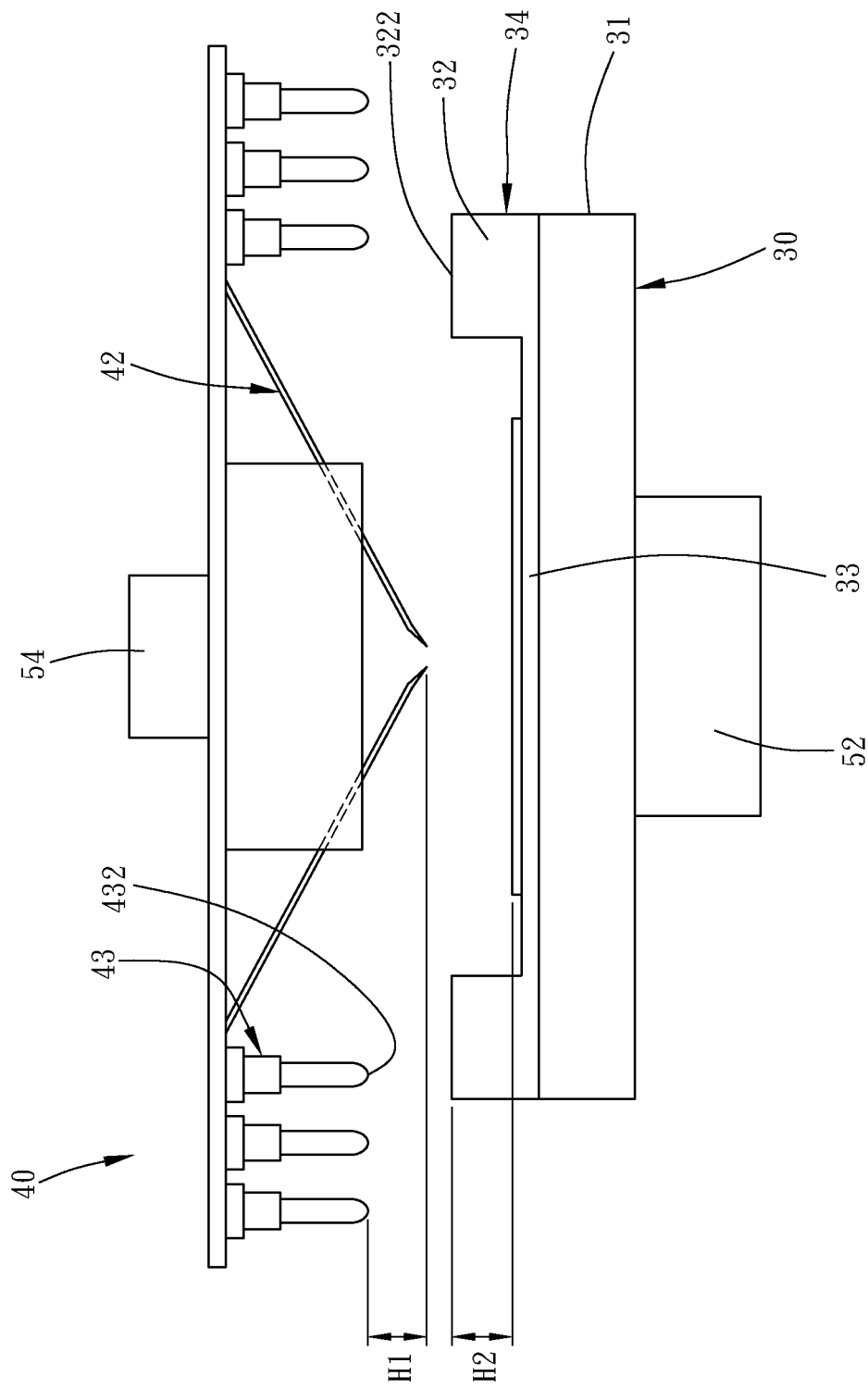

As shown in FIG. 5 and FIG. 6, the supporting device 30 in the present invention may include not only the chuck 31, but also a carrier 34. The carrier 34 is adapted for carrying the wafer 60 to be inspected. When the inspection is conducted, the carrier 34 is placed on the chuck 31 by the pick-and-place device and thus the wafer 60 disposed on the carrier 34 is placed on the chuck 31 by the curries 34. The chuck 31 shown in FIG. 5 is similar to that shown in FIG. 2 and has the above-described contact portion 32. However, the contact portion 32 shown in FIG. 5 extends higher and thus the height difference H2 is larger than or equal to the height difference H1. That is to say, the carrier 34 is relatively thinner in thickness and therefore the height thereof along the vertical axis is lower than the contact surface 322. The carrier 34 has the supporting portion 33 and is made of electrically conductive material, so that the supporting portion 33 and the contact portion 32 are electrically connected with each other. In this embodiment, the contact portion 32 is formed by a hollow-annular-shaped member, i.e. the above-described elevated plate 314, and is disposed on the main body 312 of the chuck 31 separately. Alternatively, as shown in FIG. 6, the carrier 34 may be configured to have relatively larger area and have both the lower supporting portion 33 and the higher contact portion 32 to thereby produce the height difference H2. In this way, the conventional chuck shaped as a flat table can be used to serve as the chuck 31. The supporting portion 33 of the carrier 34 is relatively thinner in thickness, which means the height thereof along the vertical axis is lower than the contact surface 322 of the contact portion 32 of the carrier 34. In this embodiment, the supporting portion 33 and the contact portion 32 of the carrier 34 are provided integrally.

As to the configuration with the height difference of the present invention, specifically speaking, when the surface of the wafer 60 is contacted by the probe tip 422 of the probe 42, the elastic contact member 43 has been abutted against the contact surface 322 and compressed a small distance. At this time, the distance of the compression of the elastic contact member 43 along the vertical axis (in the upward direction) plus the height difference H1 equals to the set value of the height difference H2. At this time, for ensuring the probe 42 to be reliably electrically connected with the wafer 60, the probe device 40 and the supporting device 30 will be further moved relative to each other to make the probe 42 further pressed on the die, so the probe 42 will be slightly deformed elastically. At this time, the distance of the compression of the elastic contact member 43 along the vertical axis equals to the above-described distance of compression plus the distance of the elastic deformation of the probe 42 along the vertical axis. This can ensure that when the wafer 60 is contacted by the probe 42, the elastic contact member 43 is reliably abutted against the contact surface 322 to effectively form a stable test loop 22.

Figure 7:
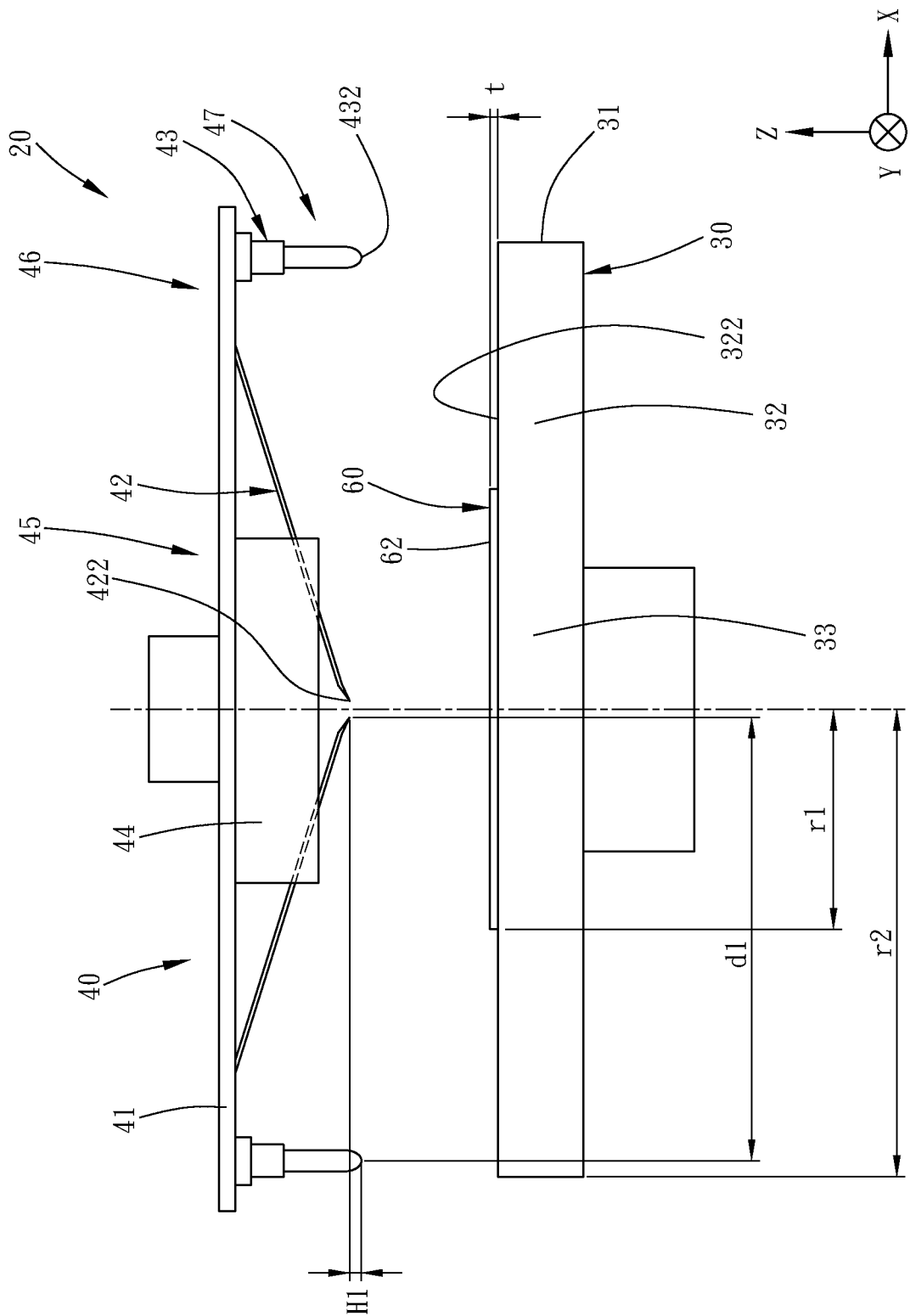
FIG. 7 is a schematic view of a wafer inspection system according to a second preferred embodiment of the present invention and a wafer.

Referring to FIG. 7, a wafer inspection system 20 according to a second preferred embodiment of the present invention is primarily different from the above-described first preferred embodiment in that the elastic contact members 43 in the first preferred embodiment are prevented from colliding with the wafer 60 by the above-described height difference of the supporting device 30 and the probe device 40, but in the second preferred embodiment this effect is primarily achieved by the structural feature of horizontal distance along the horizontal axis between the probe tips 422 of the probes 42 and the contact tips 432 of the elastic contact members 43 and the corresponding dimension design of the supporting device 30. A detailed description is given below.

Figure 8:
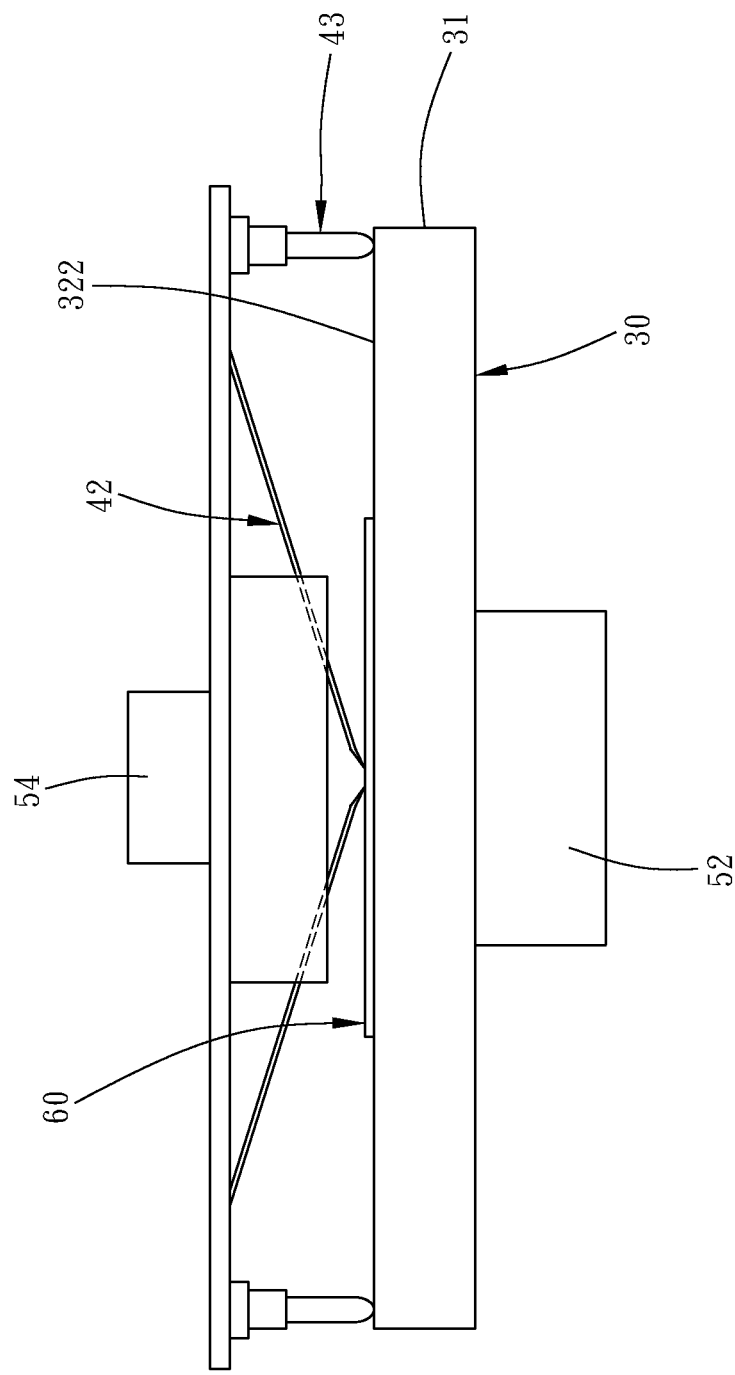
FIG. 8 and FIG. 9 are similar to FIG. 7, but showing the statuses that the wafer inspection system probes the wafer.
Figure 9:
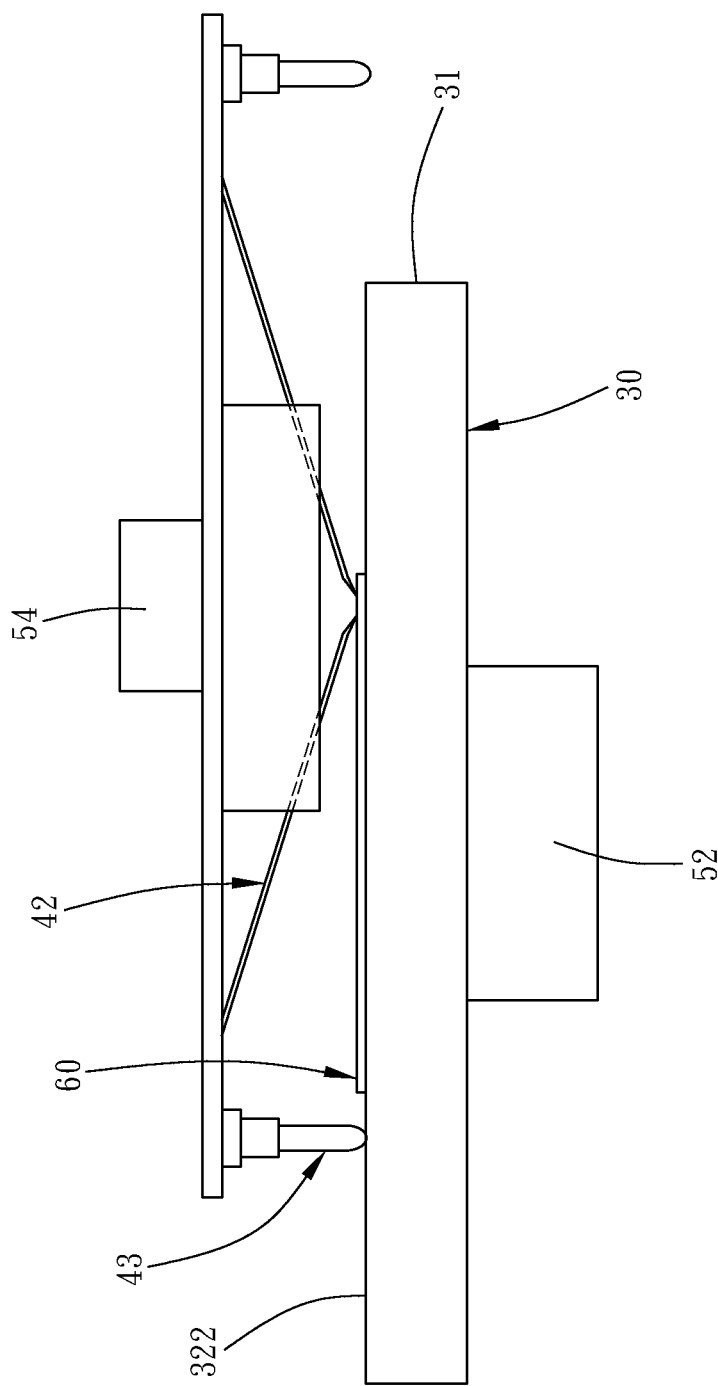

The outer perimeter of the wafer 60 is defined with a first radius r1. The horizontal distance d1 along a horizontal axis such as X-axis between the probe tip 422 of the probe 42 and the contact tip 432 of the elastic contact member 43 located closest thereto is larger than or equal to twice the first radius r1, i.e. d1>2r1. Such configuration makes the contact tips 432 of the elastic contact members 43 located out of the area corresponding to the wafer 60 when any position of the wafer 60 is contacted by the probe 42, as shown in FIG. 8 and FIG. 9, so that the elastic contact members 43 are prevented from colliding with the wafer 60. Specifically speaking, as shown in FIG. 9, when the die located on the outermost edge of the wafer 60, e.g. the rightmost side of the wafer shown in FIG. 9, is contacted by the probe 42, the elastic contact member 43 located closest to the probe tip 422 of the probe 42 in the opposite moving direction, e.g. the elastic contact member 43 located on the left side shown in FIG. 9, is still located out of the outermost edge of the wafer 60, e.g. the leftmost side of the wafer shown in FIG. 9. Meanwhile, for enabling the contact tip 432 of the elastic contact member 43 to be abutted against the contact surface 322 of the supporting device 30, a second radius r2 defined by the outer perimeter of the contact surface 322 is larger than or equal to twice the first radius r1, i.e. r2>2r1. For further ensuring the contact tip 432 of the elastic contact member 43 to be abutted against the contact surface 322 of the supporting device 30, it is preferable that the second radius r2 is larger than the above-described horizontal distance d1, but they may be equal to each other, i.e. r2>d1.

In this embodiment, the contact tips 432 of the elastic contact members 43 are located a little lower than the probe tips 422 of the probes 42 along the vertical axis (Z-axis). Therefore, the supporting device 30 has no need to be configured with the height difference and thus the chuck 31 shaped as a flat table can be applied directly thereto. The central region of the chuck 31 is served as the supporting portion 33 and the peripheral region of the chuck 31 is served as the contact portion 32. The contact surface 322 of the contact portion 32 is the same surface with the surface of the supporting portion 33 for supporting the wafer 60. Therefore, a simple configuration is provided. The front 62 of the wafer 60 is slightly higher than the contact surface 322 and the height difference therebetween is the thickness t of the wafer 60. In this manner, as long as the height difference H1 between the contact tips 432 of the elastic contact members 43 and the probe tips 422 of the probes 42 is larger than or equal to the thickness t of the wafer 60, the contact tips 432 of the elastic contact members 43 can be abutted against the contact portion 32 of the supporting device 30 when the wafer 60 is contacted by the probes 42, thereby forming the above-described test loop. Specifically speaking, when the surface of the wafer 60 is contacted by the probe tip 422 of the probe 42, the elastic contact member 43 has been abutted against the contact surface 322 and compressed a small distance. At this time, the distance of the compression of the elastic contact member 43 along the vertical axis (in the upward direction) plus the thickness t of the wafer 60 equals to the set value of the height difference H1. At this time, for ensuring the probe 42 to be reliably electrically connected with the wafer 60, the probe device 40 and the supporting device 30 will be further moved relative to each other to make the probe 42 further pressed on the die, so the probe 42 will be slightly deformed elastically. At this time, the distance of the compression of the elastic contact member 43 along the vertical axis equals to the above-described distance of compression plus the distance of the elastic deformation of the probe 42 along the vertical axis. This can ensure that when the wafer 60 is contacted by the probe 42, the elastic contact member 43 is reliably abutted against the contact surface 322 to effectively form a stable test loop 22. The supporting device 30 in this embodiment may include the carrier 34 as shown in FIG. 5, which is smaller in area than the carrier shown in FIG. 6. Specifically speaking, the carrier 34 is slightly larger in area than the wafer 60. The outer radius of the carrier 34 is larger than the outer radius of the wafer 60 and the outer radius of the carrier 34 is smaller than the outer radius of the chuck 31, so that the supporting device 30 has the contact portion 32 located around the outer periphery of the carrier 34. Alternatively, the supporting device 30 may include the carrier 34 similar to that shown in FIG. 6, which is larger in area than the carrier shown in FIG. 5. Specifically speaking, the carrier 34 is larger in area than the wafer 60. The outer radius of the carrier 34 is larger than the outer radius of the wafer 60 and the outer radius of the carrier 34 equals to the outer radius of the chuck. Therefore, the central region of the carrier 34 is served as the supporting portion 33 of the supporting device 30 and the peripheral region of the carrier 34 is served as the contact portion 32 of the supporting device 30. However, the carrier 34 in this embodiment should be shaped as a flat plate. In other words, the carrier 34 has both the supporting portion 33 and the contact portion 32 and the supporting portion 33 and the contact portion 32 are equal in height.

Figure 10:
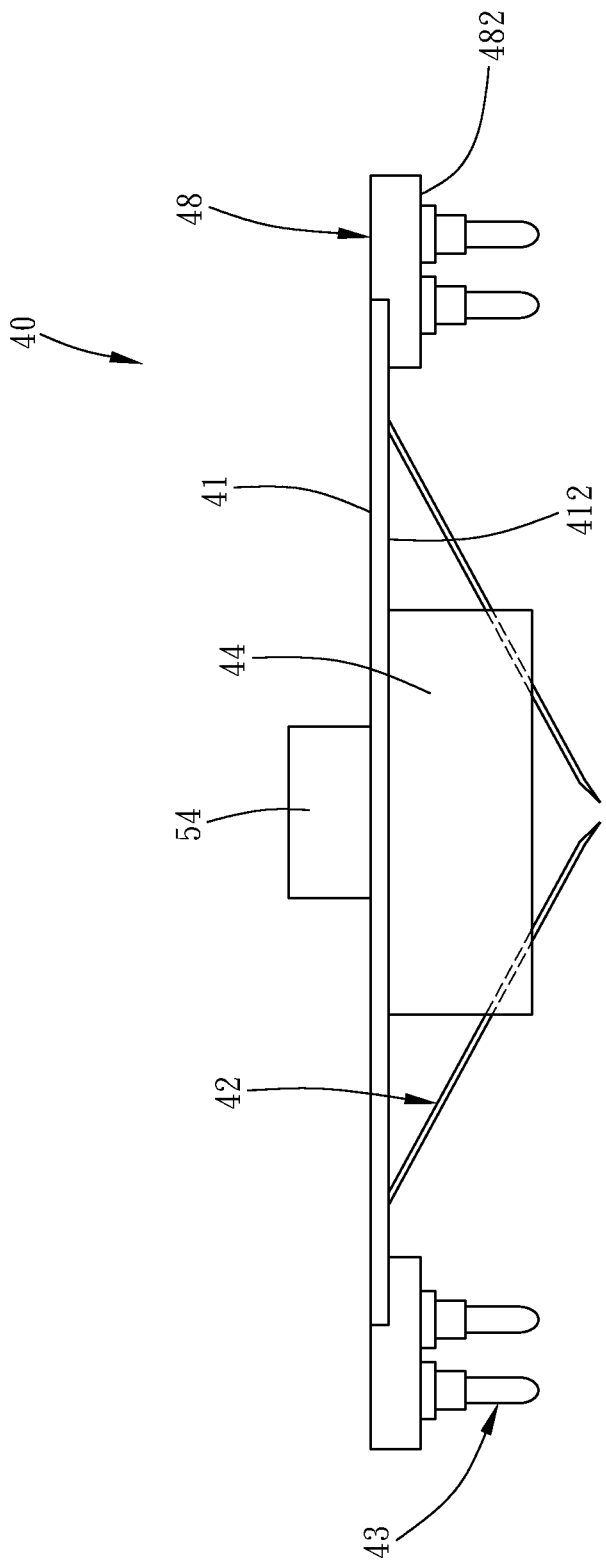
FIG. 10 and FIG. 11 are schematic views showing other configurations of the probe device of the wafer inspection system.
Figure 11:
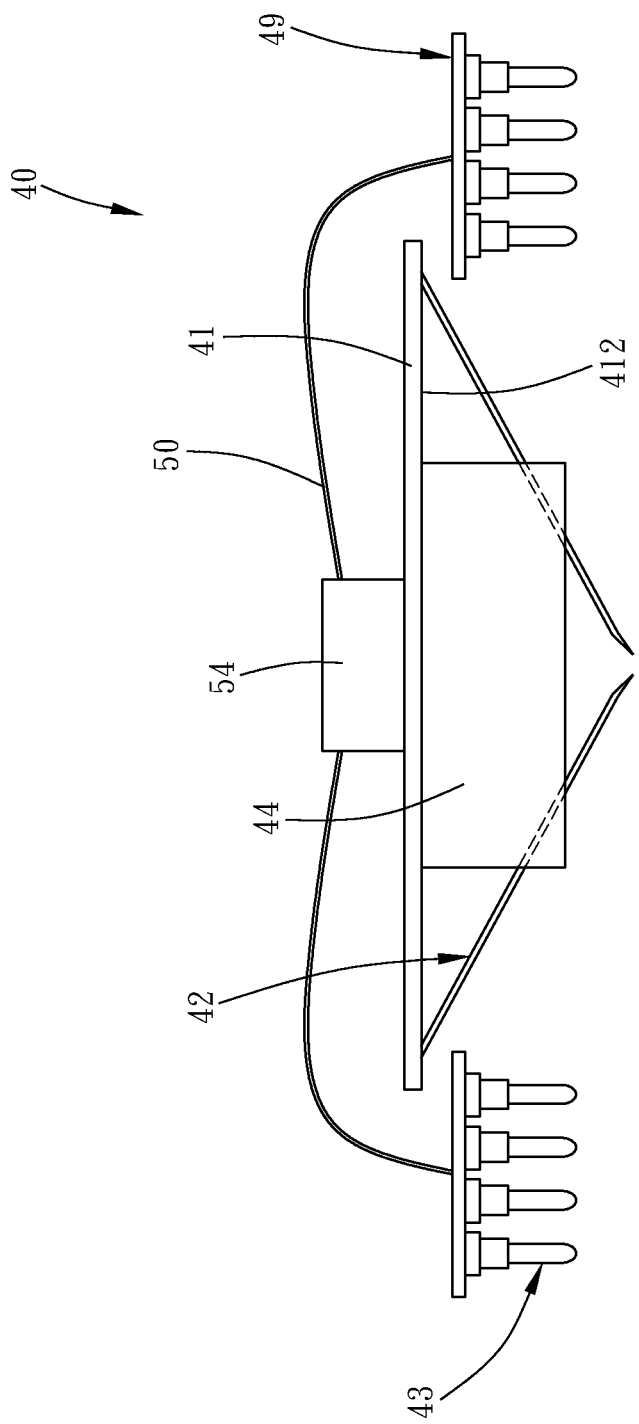

In the present invention, no matter the configuration with the height differences H1 and H2 as provided in the first preferred embodiment or the configuration with the horizontal distance d1 as provided in the second preferred embodiment is adopted, the probe device 40 may be configured as described below that the elastic contact members 43 and the probes 42 are arranged separately, as shown in FIG. 10 and FIG. 11. However, the configurations as shown in FIG. 2 to FIG. 9 that the elastic contact members 43 and the probes 42 are disposed on the same substrate 41 has the advantage of simple configuration.

Compared with the probe devices 40 as shown in FIG. 2 to FIG. 9, the probe device 40 shown in FIG. 10 is smaller in area of the substrate 41 and the outer perimeter of the substrate 41 is connected with one or a plurality of installation members 48, such as circuit boards, by engaging or other manners. The probes 42 are disposed on the lower surface 412 of the substrate 41 and the elastic contact members 43 are disposed on the lower surface 482 of the installation member 48, thereby forming the probe device 40 similar to that shown in FIG. 2 to FIG. 9 to attain the same effect. The probe device 40 shown in FIG. 11 is similar to that shown in FIG. 10, while the installation member 49 shown in FIG. 11 can be disposed on a fastening device (not shown) to be relatively fixed to the substrate 41, separated from the substrate 41, and located around the outer periphery of the substrate 41. The installation member 49 may be a metal cathode plate and electrically connected with the negative contact of the driver IC 54 through conductive wires 50. In this manner, the probe device 40 similar to that shown in FIG. 2 to FIG. 9 is also provided to attain the same effect. The probe devices 40 shown in FIG. 10 and FIG. 11 have the advantage that the existing probe device can be applied in the present invention as long as the installation member 48 or 49 provided with the elastic contact members 43 is further installed therewith. Besides, the required height difference can be achieved by the thickness difference between the installation member 48 and the substrate 41 or the height difference between the installation member 49 and the substrate 41.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

For example, the probe region 45 includes the electrically conductive probe 42 protruding toward the supporting device 30. However, the present invention is unlimited thereto. The probe device 40 may be equipped with a plurality of probes 42.

Besides, in the embodiments, the probe device 40 is fixed and stationary, and the supporting device 30 is disposed on a moving device 52 and can be driven by the moving device 52 to move along X-axis, Y-axis and Z-axis. However, the present invention is unlimited thereto. The supporting device 30 may be fixed and stationary and the probe device 40 is disposed on a moving device (not shown) and can be driven by the moving device to move along X-axis, Y-axis and Z-axis.

In addition, in the embodiments, the positive contacts of the dies are located on the front 62 of the wafer 60 and the back 63 of the wafer 60 is the common plane negative contact of the dies. However, the present invention is unlimited thereto. The negative contacts of the dies may be located on the front 62 of the wafer 60 and the back 63 of the wafer 60 is the common plane positive contact of the dies.

Furthermore, in the embodiments, the elevated plate 314 is separately disposed on the main body 312 of the chuck 31 to form the contact portion 32. However, the present invention is unlimited thereto. The elevated plate 314 (the contact portion 32) and the main body 312 of the chuck 31 may be provided monolithically. Besides, in the embodiment that the carrier 34 has the supporting portion 33 and the contact portion 32, the supporting portion 33 and the contact portion 32 of the carrier 34 are provided monolithically. However, the present invention is unlimited thereto. The supporting portion 33 and the contact portion 32 of the carrier 34 may be provided separately and then connected to form an integrated member.

What is claimed is:

1. A wafer inspection system, which is defined with a vertical axis and a horizontal axis perpendicular to the vertical axis, the wafer inspection system comprising:
    a supporting device comprising a supporting portion and a contact portion located around an outer periphery of the supporting portion, the supporting portion and the contact portion being electrically conductive and electrically connected with each other, the supporting portion being configured to support a back of a wafer in a way that the wafer is electrically connected with the contact portion; and
    a probe device disposed above the supporting portion and the contact portion in a way that the probe device and the supporting device are movable relative to each other along the vertical axis and the horizontal axis, the probe device is capable of being electrically connected with a driver IC and transmitting a test signal of the driver IC, the probe device comprising a probe region and a contact region located around an outer periphery of the probe region, the probe region comprising an electrically conductive probe protruding downwardly toward the supporting device for contacting a front of the wafer, the contact region comprising an electrically conductive module, the electrically conductive module comprising a plurality of elastic contact members protruding toward the supporting device, when the front of the wafer is contacted by the probe, the electrically conductive module and the contact portion of the supporting device being abutted against each other, thereby forming a test loop;
    wherein the probe of the probe device has a probe tip for contacting the wafer; each of the elastic contact members has a contact tip for being abutted against the contact portion of the supporting device; the contact portion of the supporting device has a contact surface for the contact tip of the elastic contact member to be abutted thereagainst; the contact tip of each of the elastic contact members is located higher than the probe tip of the probe along the vertical axis; the contact surface of the supporting device is located higher than the front of the wafer along the vertical axis.

2. The wafer inspection system as claimed in claim 1, wherein a height difference between the contact tip of each of the elastic contact members and the probe tip of the probe along the vertical axis is smaller than or equal to a height difference between the contact surface of the supporting device and the front of the wafer along the vertical axis.

3. The wafer inspection system as claimed in claim 1, wherein the probe device comprises a substrate; a lower surface of the substrate faces toward the supporting device; the probe and the elastic contact members are disposed on the lower surface of the substrate; when the front of the wafer is contacted by the probe, at least one of the elastic contact members is abutted against the contact portion of the supporting device.

4. The wafer inspection system as claimed in claim 1, wherein the probe device comprises a substrate and an installation member disposed on an outer perimeter of the substrate; a lower surface of the substrate and a lower surface of the installation member face toward the supporting device; the probe is disposed on the lower surface of the substrate; the elastic contact members are disposed on the lower surface of the installation member; when the front of the wafer is contacted by the probe, at least one of the elastic contact members is abutted against the contact portion of the supporting device.

5. The wafer inspection system as claimed in claim 1, wherein the probe device comprises a substrate and an installation member disposed around and separated from an outer periphery of the substrate; a lower surface of the substrate and a lower surface of the installation member face toward the supporting device; the probe is disposed on the lower surface of the substrate; the elastic contact members are disposed on the lower surface of the installation member; when the front of the wafer is contacted by the probe, at least one of the elastic contact members is abutted against the contact portion of the supporting device.

6. The wafer inspection system as claimed in claim 1, wherein the supporting device comprises a chuck having the contact portion and the supporting portion, and the chuck is configured for directly supporting the wafer on the supporting portion.

7. The wafer inspection system as claimed in claim 6, wherein the chuck comprises a main body and an elevated plate fixed to the main body; the supporting portion is formed by the main body; the elevated plate is hollow-annular-shaped and forms the contact portion.

8. The wafer inspection system as claimed in claim 1, wherein the supporting device comprises a chuck having the contact portion, and a carrier having the supporting portion, the carrier is configured for supporting the wafer on the supporting portion such that the wafer is placed on the chuck by the carrier; wherein the chuck comprises a main body and an elevated plate fixed to the main body; the carrier is placed on the main body; the elevated plate is hollow-annular-shaped and forms the contact portion.

9. The wafer inspection system as claimed in claim 1, wherein the supporting device comprises a chuck and a carrier having the contact portion and the supporting portion; the carrier is configured for supporting the wafer on the supporting portion such that the wafer is placed on the chuck by the carrier.

10. A wafer inspection system, which is defined with a vertical axis and a horizontal axis perpendicular to the vertical axis, the wafer inspection system comprising:

a supporting device comprising a supporting portion and a contact portion located around an outer periphery of the supporting portion, the supporting portion and the contact portion being electrically conductive and electrically connected with each other, the supporting portion being configured to support a back of a wafer in a way that the wafer is electrically connected with the contact portion; and a probe device disposed above the supporting portion and the contact portion in a way that the probe device and the supporting device are movable relative to each other along the vertical axis and the horizontal axis, the probe device is capable of being electrically connected with a driver IC and transmitting a test signal of the driver IC, the probe device comprising a probe region and a contact region located around an outer periphery of the probe region, the probe region comprising an electrically conductive probe protruding downwardly toward the supporting device for contacting a front of the wafer, the contact region comprising an electrically conductive module, the electrically conductive module comprising a plurality of elastic contact members protruding toward the supporting device, when the front of the wafer is contacted by the probe, the electrically conductive module and the contact portion of the supporting device being abutted against each other, thereby forming a test loop;

wherein an outer perimeter of the wafer is defined with a first radius; each of the elastic contact members has a contact tip for being abutted against the contact portion of the supporting device; the contact portion of the supporting device has a contact surface for the contact tip of the elastic contact member to be abutted thereagainst; an outer perimeter of the contact surface is defined with a second radius; the second radius is larger than or equal to twice the first radius; the probe has a probe tip for contacting the wafer; a horizontal distance along the horizontal axis between the probe tip of the probe and the contact tip of the elastic contact member located closest to the probe is larger than or equal to twice the first radius.

11. The wafer inspection system as claimed in claim 10, wherein the horizontal distance along the horizontal axis between the probe tip of the probe and the contact tip of the elastic contact member located closest to the probe is smaller than or equal to the second radius.

12. The wafer inspection system as claimed in claim 10, wherein the contact tip of each of the elastic contact members is located lower than the probe tip of the probe along the vertical axis.

13. The wafer inspection system as claimed in claim 12, wherein a height difference between the contact tip of each of the elastic contact members and the probe tip of the probe along the vertical axis is larger than or equal to a height difference between the contact surface of the supporting device and the front of the wafer along the vertical axis.

14. The wafer inspection system as claimed in claim 10, wherein the probe device comprises a substrate; a lower surface of the substrate faces toward the supporting device; the probe and the elastic contact members are disposed on the lower surface of the substrate; when the front of the wafer is contacted by the probe, at least one of the elastic contact members is abutted against the contact portion of the supporting device.

15. The wafer inspection system as claimed in claim 10, wherein the probe device comprises a substrate, and an installation member disposed on an outer perimeter of the substrate; a lower surface of the substrate and a lower surface of the installation member face toward the supporting device; the probe is disposed on the lower surface of the substrate; the elastic contact members are disposed on the lower surface of the installation member; when the front of the wafer is contacted by the probe, at least one of the elastic contact members is abutted against the contact portion of the supporting device.

16. The wafer inspection system as claimed in claim 10, wherein the probe device comprises a substrate, and an installation member disposed around and separated from an outer periphery of the substrate separately from the substrate; a lower surface of the substrate and a lower surface of the installation member face toward the supporting device; the probe is disposed on the lower surface of the substrate; the elastic contact members are disposed on the lower surface of the installation member; when the front of the wafer is contacted by the probe, at least one of the elastic contact members is abutted against the contact portion of the supporting device.

17. The wafer inspection system as claimed in claim 10, wherein the supporting device comprises a chuck having the contact portion and the supporting portion, and the chuck is configured for directly supporting the wafer on the supporting portion.

18. The wafer inspection system as claimed in claim 17, wherein the chuck comprises a main body, and an elevated plate fixed to the main body; the supporting portion is formed by the main body; the elevated plate is hollow-annular-shaped and forms the contact portion.

19. The wafer inspection system as claimed in claim 10, wherein the supporting device comprises a chuck having the contact portion, and a carrier having the supporting portion, the carrier is configured for supporting the wafer on the supporting portion such that the wafer is placed on the chuck by the carrier; wherein the chuck comprises a main body, and an elevated plate fixed to the main body; the carrier is placed on the main body; the elevated plate is hollow-annular-shaped and forms the contact portion.

20. The wafer inspection system as claimed in claim 10, wherein the supporting device comprises a chuck and a carrier having the contact portion and the supporting portion; the carrier is configured for supporting the wafer on the supporting portion such that the wafer is placed on the chuck by the carrier.

21. A wafer inspection system, which is defined with a vertical axis and a horizontal axis perpendicular to the vertical axis, the wafer inspection system comprising:

a supporting device comprising a supporting portion and a contact portion located around an outer periphery of the supporting portion, the supporting portion and the contact portion being electrically conductive and electrically connected with each other, the supporting portion being configured to support a back of a wafer in a way that the wafer is electrically connected with the contact portion; and a probe device disposed above the supporting portion and the contact portion in a way that the probe device and the supporting device are movable relative to each other along the vertical axis and the horizontal axis, the probe device is capable of being electrically connected with a driver IC and transmitting a test signal of the driver IC, the probe device comprising a probe region and a contact region located around an outer periphery of the probe region, the probe region comprising an electrically conductive probe protruding downwardly toward the supporting device for contacting a front of the wafer, the contact region comprising an electrically conductive module, the electrically conductive module comprising a plurality of elastic contact members protruding toward the supporting device, when the front of the wafer is contacted by the probe, the electrically conductive module and the contact portion of the supporting device being abutted against each other, thereby forming a test loop;

wherein the probe of the probe device has a probe tip for contacting the wafer; each of the elastic contact members has a contact tip for being abutted against the contact portion of the supporting device; the contact portion of the supporting device has a contact surface for the contact tip of the elastic contact member to be abutted thereagainst; the contact tip of each of the elastic contact members is located higher than the probe tip of the probe along the vertical axis; the contact surface of the supporting device is located higher than the front of the wafer along the vertical axis;

wherein the elastic contact members are arranged around two opposite sides of the probe;

wherein the probe device further comprises a substrate; the driver IC is disposed on the substrate and electrically connected with the probe and the elastic contact members through internal circuits of the substrate respectively;

wherein the test signal outputted from the driver IC is transmitted via the test loop from the probe to the front of the wafer and then back to the driver IC from the back of the wafer via the supporting portion and the contact portion of the supporting device and the electrically conductive module of the probe device sequentially.

* * * * *